United States Patent

Zaitseva et al.

[11] 4,000,426
[45] Dec. 28, 1976

[54] APPARATUS FOR FEEDING PARTS IN ION-BEAM MACHINING

[76] Inventors: Aita Konstantinovna Zaitseva, ulitsa Verkhnyaya, 3, kv. 5, Moscow; Evgeny Grigorievich Zhukov, Sovetsky prospekt, 26, kv. 110, Ivanteevka Moskovskoi oblasti; Naum Yakovlevich Lipinetsky, ulitsa Kibalchicha, 2, korpus 2, kv. 32, Moscow, all of U.S.S.R.

[22] Filed: May 15, 1975

[21] Appl. No.: 577,745

[52] U.S. Cl. .................. 250/453; 219/121 EB; 250/492 B
[51] Int. Cl.² ........................................ H01J 37/00
[58] Field of Search ......... 250/398, 399, 400, 453, 250/492 B; 219/121 EB

[56] References Cited

UNITED STATES PATENTS

| | | | |
|---|---|---|---|
| 3,664,188 | 5/1972 | Kocbott | 250/453 |
| 3,689,766 | 9/1972 | Freeman | 250/400 |

*Primary Examiner*—Craig E. Church

[57] ABSTRACT

An apparatus for feeding parts in ion beam machining, comprising a sealed case with an aperture to admit an ion beam, the case accommodating a holding and moving arrangement made in the form of a detachable closed-loop conveyor for the parts. The closed-loop conveyor is enclosed in a framework turnable together with the conveyer about the axis thereof intersecting the part being machined at a definite angle relative to the axis of the ion beam. This permits machining the part on all sides without altering the direction of the ion beam, and allows withdrawal of all other parts and devices from the zone of the ion beam.

8 Claims, 9 Drawing Figures

FIG. 6

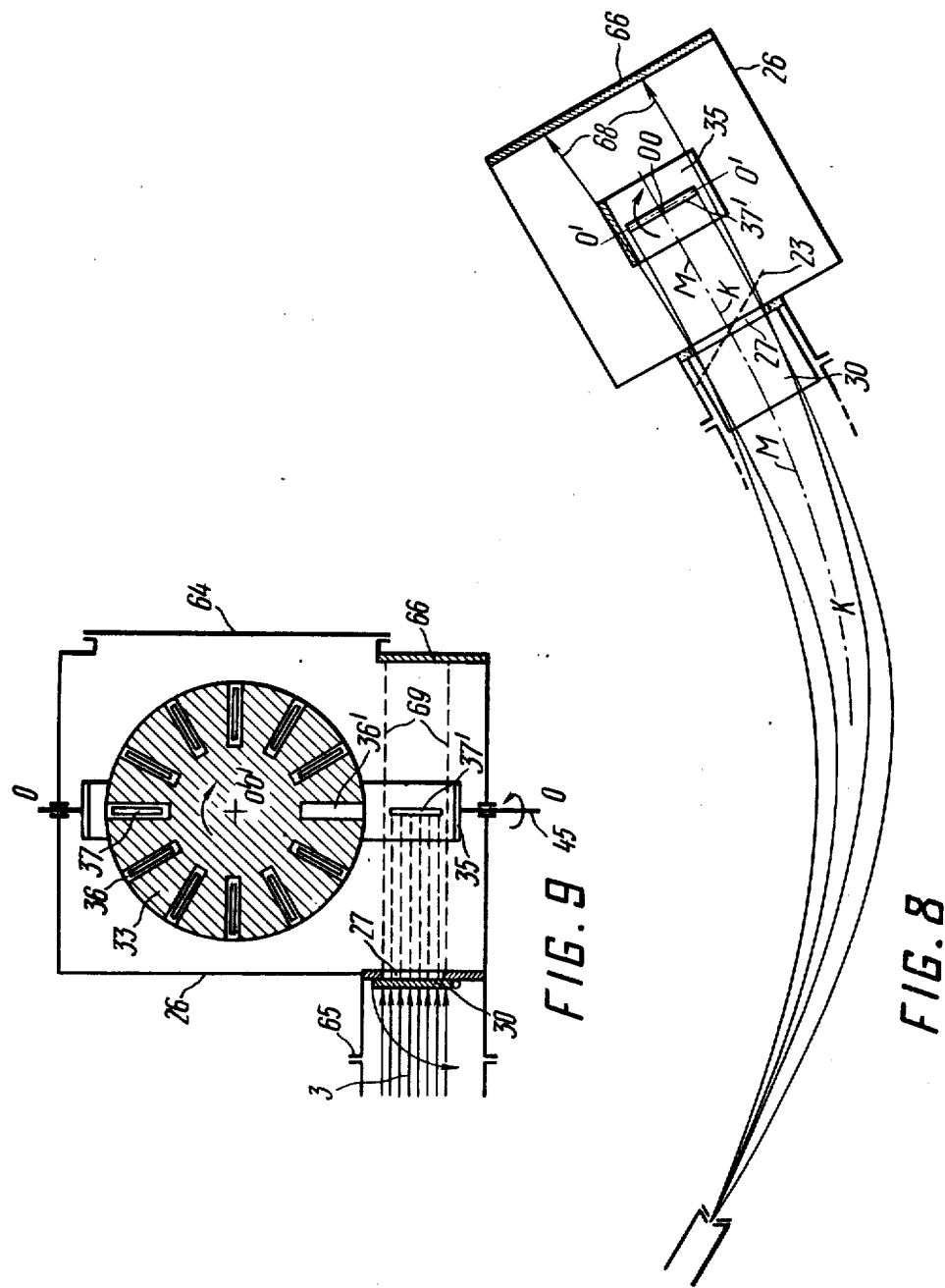

APPARATUS FOR FEEDING PARTS IN ION-BEAM MACHINING

The present invention relates to apparatus for feeding parts in multilateral machining effected by means of a flow of an appropriate substance, specifically, with an ion beam. The apparatus of the present invention is applicable in various fields of engineering when operating on line with machines employing a flow of substance, for example, a flow of fluid, a beam of charged or neutral particles, etc. In particular, the apparatus can be used for feeding semiconductor plates (components) to the target plane of an ion-beam machine, wherein the part surfaces are machined with a beam of accelerating ions of a substance.

Known in the art is an apparatus for feeding parts (of the order of several hundred pieces) in bilateral machining effected by means of an ion beam.

Inasmuch as the advantages of the apparatus for feeding parts in ion-beam machining, according to the invention, can be best understood when considering the description of the above prior art apparatus, it will now be described in detail with reference to the appended drawings, wherein:

FIGS. 8 and 9 show schematically the ion beam trajectory inside the case of the apparatus, according to the invention.

Figure 1:
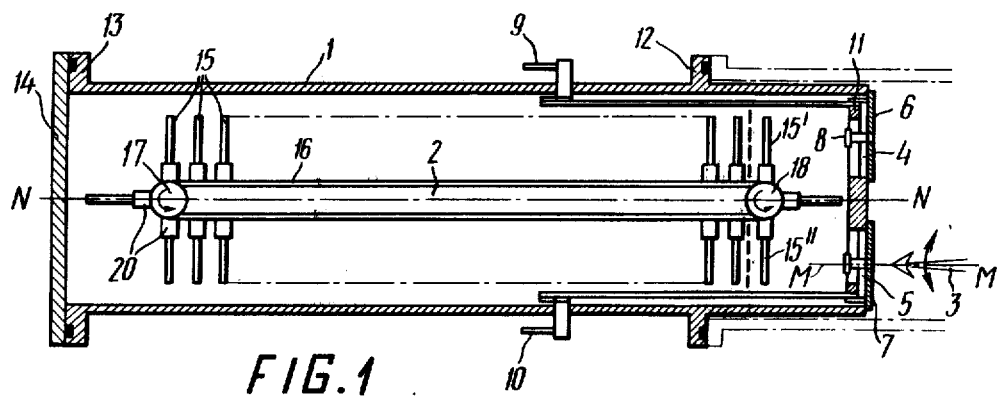

Referring now to FIG. 1, the prior art apparatus comprises a sealed case 1 accommodating a closed-loop conveyer 2. To admit an ion beam 3, two apertures 4 and 5 are provided on a respective side. Said apertures 4 and 5 are closed with doors 6 and 7 arranged in the plane of the ion-beam machine target and intended to admit said ion beam 3. Probes 8 built into the doors 4 and 5 serve to measure and check distribution of the ion beam current over the target area. The doors 6 and 7 are opened by means of handles 9 and 10. The apertures 4 and 5 are furnished with a shutter 11 intended to control the aperture area.

The sealed case 1 incorporates a flange 12 serving to attach the apparatus to an ion-beam machine (shown in the drawing by the dot-and-dash lines), and mounts a flange 13 tightly sealed with a cover 14 and serving to permit loading and unloading of the closed-loop conveyer 2 with holders 15 carrying the parts to be machined. The holder 15 can carry one or several parts being machined, according to the relationship between the part size and the target area.

Figure 2:
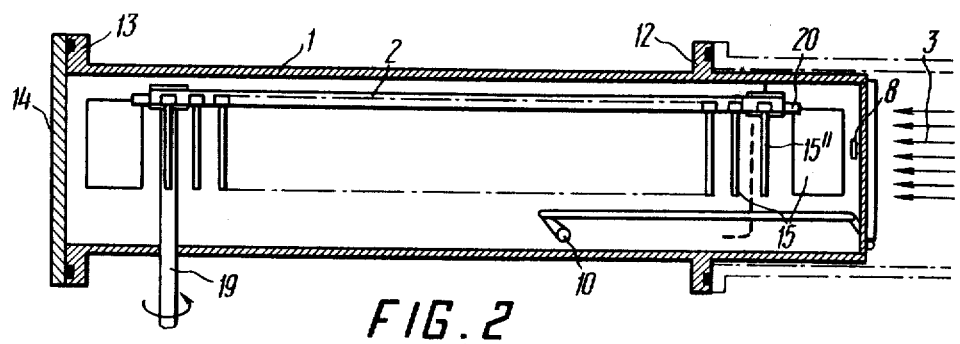
FIGS. 1 and 2 show schematically, in plan and elevation, known apparatus for feeding parts in ion-beam machining, incorporating a closed-loop conveyer in the form of a chain stretched between two sprockets.

The closed-loop conveyer 2 comprises a chain 16 stretched between two similar sprockets: a driving sprocket 17 and a driven sprocket 18. The driving sprocket 17 is seated on a shaft 19 (FIG. 2) coupled to an external drive (not shown). The chain 16 mounts attachment fittings 20 from which holders 15 carrying the parts being machined are suspended. The holders 15 fitted to the chain 16 (FIG. 1) are spaced by a length equal to ¼ of the pitch circle circumference of the sprockets 17 and 18, with the result that the holder 15' carrying the parts being machined is positioned opposite the aperture 4, and the holder 15" is placed opposite the aperture 5. With the closed-loop conveyer 2 moved at required intervals, it is loaded with the holders 15 through the open flange 13. Then said flange 13 is sealed with the cover 14, and the air is evacuated from the interior of the sealed case 1 and from the ion-beam machine chamber till the desired vacuum is attained. The scanning ion beam 3 formed by the ion-beam machine is directed to one of the doors, let us say, on the door 7. The probes 8 are operated, and a required current density of the ion beama 3 and uniform distribution of the ion beam current over the target area are adjusted. The door 7 is opened, and the scanning ion beam 3 is directed through the aperture 5 on the surfaces of the parts to be machined installed in the fixed holder 15'. On completion of treatment of the parts carried by the holder 15", a shaft 19 moves the conveyer 2 through one step, so that the next holder 15 is prepared for treatment. Alternate displacement of the holder 15 carrying the parts is effected automatically in response to a predetermined program.

To permit machining of the opposite side of each part carried by the holders 15, the door 7 is shut, and the ion beam 3 of the same or some other substance is directed to the door 6, whereupon the foregoing operations are repeated.

However, the same movement of the closed-loop conveyer 2 in the foregoing prior-art apparatus is utilized to accomplish two operations: feeding the holders 15 with the parts to be treated, and turning them through 180° C. As a consequence, the constructional features of the conveyer 2 and the direction of the longitudinal axis NN of the closed-loop conveyer relative to the axis MM of the ion beam 3 are limited to a certain range. The axis MM must in all cases be parallel with the axis NN. The result is that apart from the holder 15' or 15" with the parts to be machined, all other holders 15 mounted on the closed-circuit conveyer 2 are located in the zone of the ion beam 3 which is detrimental to the quality of the parts being machined.

Figure 5:
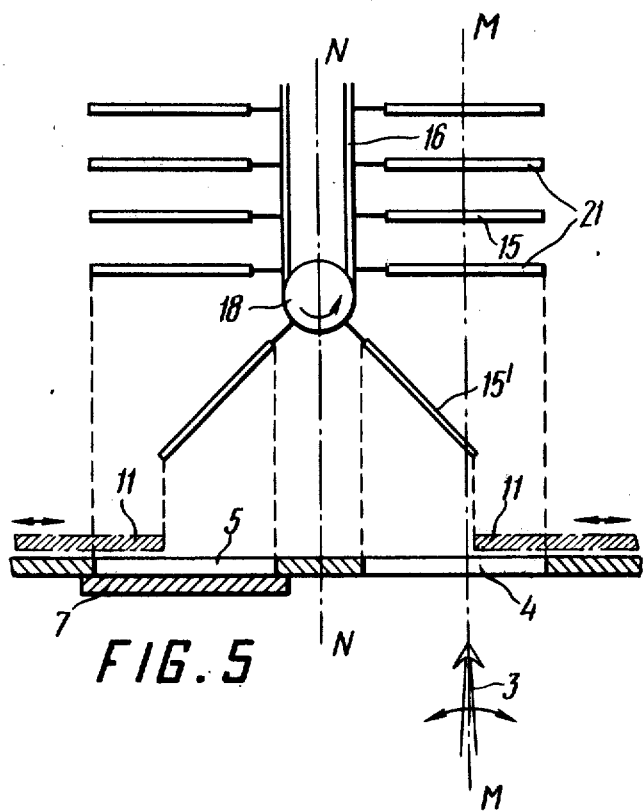

If the parts must be machined on two sides, the holder 15 is to be constructed so that no gaps, slots and holes remain in the machined area to prevent the ion beam 3 from falling on the subsequent holder 15 with the parts. Otherwise, special protective measures must be taken as is the case when a holder 21 with a screen (FIG. 5) is placed between the holders 15 with the parts being machined, or when a screen retractable during travel of the conveyer 2 (shown by a dotted line in FIGS. 1 and 2) is placed behind the exposed holder 15' or 15". However, in the first case, said protection brings about a loss in the operating efficiency of the apparatus, and in the second case, the construction of the apparatus is complicated and the service reliability is impaired. In addition, similar complications occur when the parts must be machined at an angle other than 90° between the plane of the holder 15' carrying the parts, and the axis MM of the ion beam 3, because the holder 15 following the holder with the parts being machined is partly exposed to the ion beam 3.

The holders 15 carrying the parts are treated by the ion beam 3, the axis MM thereof is deflected from the center line KK (FIG. 3) of the ion-beam machine toward the sides of the vacuum chamber thereof (not shown). As a result, the ion beam 3 more readily comes into contact with the side walls of the sealed case 1 (see ion beams 22 in FIG. 3), the substance of the walls acted upon the ion beam is diffused, and the content of diffusion products in the working zone rises, which affects the quality of the parts being machined.

Besides, deflection of the axis MM of the ion beam 3 from the center line KK of the ion-beam machine brings about differences in the distance between the holders 15' and 15" and a focal plane 23 of the ion beam 3, whereby the process of machining is not reproduced accurately and the quality of the machined parts is impaired.

Since a clearance exists between the edges of the apertures 4 and 5 (FIG. 1) and those of the holders 15' and 15", a part of the ion beam 3 (see the beams 24 in FIG. 3, and the beams 25 in FIG. 4) extends beyond said holders 15' and 15". The beams 24 and 25 project along the closed-loop conveyer 2 as far as the sealing cover 14 and fall on the parts of the actuating devices (eg., the fittings 20, shaft 19, etc.) occurring on the path thereof, with the result that the material of said parts difuses under the action of the ion beam. Since the holders 15 carrying the parts being machined are located within the zone of the ion beam 3 and within the space containing the products of diffusion, said products reside on the part surfaces and affect the quality of said parts.

The chain 16 of the closed-loop conveyer 2 is loaded heavily because it carries a plurality of the holders 15 with the parts being machined (from tens to one hundred pieces). As a consequence, an error in location of the fittings 20 and, hence, in location of the holders 15, 15' and 15" carrying the parts being machined is produced in relation to the edges of the apertures 4 and 5, so that the clearances, wherethrough the ion beams 24 (FIG. 3) and ion beams 25 (FIG. 4) extend beyond the exposed holder 15' or 15", are increased on the one hand, and said ion beams fall more readily on the parts in the holders 15, on the other.

Inasmuch as the holders 15 carrying the parts are loaded into and unloaded from the conveyer rigidly attached to the sealed case, much time is required and the operating efficiency of the machine is affected.

Owing to the fact that the holder 15' or 15" delivered to the machining area is fixed rigidly, the range of application of the prior art apparatus is limited to a certain type of the ion-beam machines. Said apparatus cannot be used in machines utilizing a pencil ion beam capable of scanning in a single direction.

It is an object of the present invention to provide an apparatus for feeding parts in machining accomplished by means of an ion beam of any shape, with any scanning mode and with any angle of incidence on the part being machined.

With this and other objects in view, an apparatus is herein proposed for feeding parts to the target plane in multilateral machining effected by means of an ion beam, comprising a sealed case with an orifice to admit ion beam, shut with a door incorporating probes to check distribution of the ion current over the target area, with a part holding and moving arrangement made in the form of a closed-loop conveyer and enclosed, according to the invention, in a framework located inside the case and made turnable together with said conveyer about the longitudinal axis of said framework, arranged at a definite angle to the axis of the ion beam and intersecting the part delivered to the machining area, with the result that said part can be machined on all sides without altering the direction of the ion beam, and other parts and devices translating motion to the conveyer and framework can be withdrawn from the zone of the ion beam.

It is expedient that the angle between the longitudinal axis of the framework and that of the ion beam be equal to 90°.

It is likewise expedient that the conveyer be detachable.

It is advisable that said conveyer mount detachable holders carrying parts being machined.

The invention will now be described in greater detail with reference to a preferred embodiment thereof taken in conjunction with FIGS. 6–9 in the accompanying drawings.

Figures 6, 7:
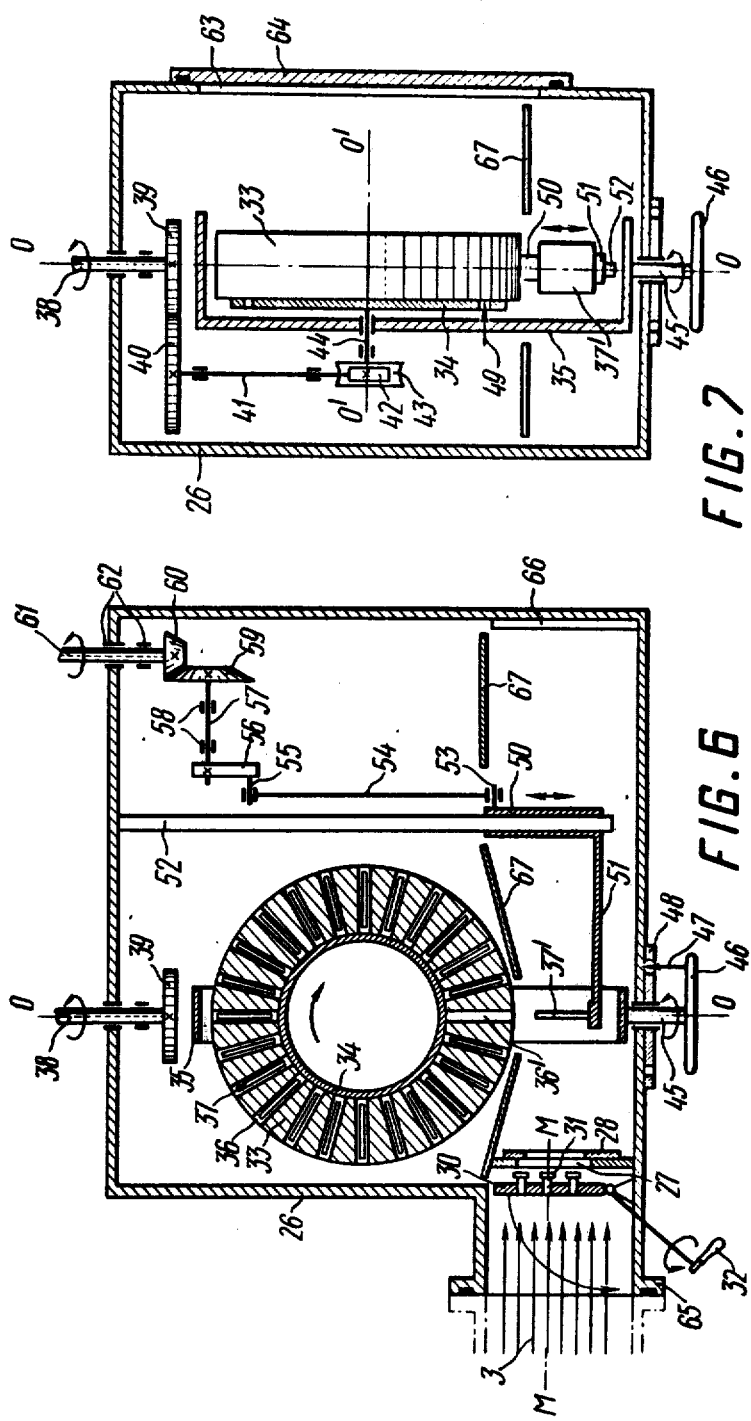
FIGS. 6 and 7 show schematically in front and side sections an apparatus comprising a closed-loop conveyer in the form of a drum, according to the invention.

FIGS. 6 and 7 show schematically an apparatus comprising a closed-loop conveyer in the form of a drum, according to the invention;

FIGS. 8 and 9 show schematically the ion beam trajectory inside the case of the apparatus, according to the invention.

The apparatus of the present invention used for successive feeding of parts to the target plane in multilateral machining effected by means of a scanning ion beam 3 comprises a sealed case 26 (FIG. 6) wherein an aperture 27 shut with movable shutters 28 is provided to admit the ion beam 3. The aperture 27 is closed with a door 30 incorporating probes 31 serving to measure distribution of the ion beam current over the target area in an ion-beam machine. The door 30 is operated by a handle 32. The sealed case 26 accommodates three actuating devices: a part holding and moving arrangement, an arrangement for feeding holders with parts to the machining area, and an arrangement for turning a framework enclosing a closed-loop conveyer.

Said part holding and moving arrangement comprises said closed-loop conveyer made in the form of a detachable drum 33 seated on a hub 34 attached to a framework 35 (FIG. 7) and revolvable about the lateral axis 0'0' thereof. The detachable drum 33 is provided with radial slots 36 used to introduce and attach holders 37 carrying the parts to be machined.

It should however be noted that said closed-loop conveyer may also be made in a form different from the drum which is preferred herein.

Owing to the fact that the holders 37 are seated on the drum which can mount tens of holders 37 or even more than one hundred holders, the arrangement is loaded and unloaded in a very short time (of 1 to 2 minutes). The holders 37 with the parts can be loaded on and unloaded from the closed-loop conveyer (such as the drum 33) either independently or in step with the operation of the ion-beam machine.

Turning again to FIGS. 6 and 7, the arrangement for revolving the detachable drum 33 comprises a driving shaft 38 coupled to an external drive (not shown in the drawings). The shaft 38 receives a spur gear 39 mating with a gear 40 (FIG. 7), the shaft 41 thereof mounts a worm 42 linked with a gear 43 seated on a shaft 44. The shaft 44 is attached to the framework 35 and is arranged along the lateral axis 0'4' thereof (FIG. 7). The hub 34 is rigidly attached to the shaft 44.

The arrangement for turning the framework 35 (FIG. 6) comprises a shaft 45, one end of which is rigidly attached to the framework 35, the other end carrying a handwheel 46 projecting out of the case 26. The handwheel 46 incorporating a locking pin 47 mating with a detent 48 rigidly attached to the outside surface of the sealed case 26. The shaft 45 freely revolves about the longitudinal axis 00 of the framework 35, which intersects a holder 37' carrying the parts being machined and placed in the target plane in the ion-beam machine. The longitudinal axis 00 of the framework 35 is arranged at an angle of 90 deg to the axis MM of the ion beam 3. The axis MM of the ion beam 3 is aligned with the center line KK (FIG. 8) of the ion-beam machine. Since the longitudinal axis 00 of the framework 35 (FIG. 6) at the same time constitutes the longitudinal axis of the closed-loop conveyer (such as the drum 33) and is normal to the axis MM of the ion beam 3, the closed-loop conveyer is withdrawn from the zone of the ion beam 3 and from the space wherein diffusion products are contained due to diffusion of the material of the inside walls of the sealed case 26 acted upon by the ion beam 3.

In addition, the arrangement of the holders 37 with the parts being machined inside the radial slots 36 provided in the detachable drum 33 permits additional screening of the parts and protection thereof against the products of diffusion. Consequently, the quality of the machined parts is improved.

Figure 3:
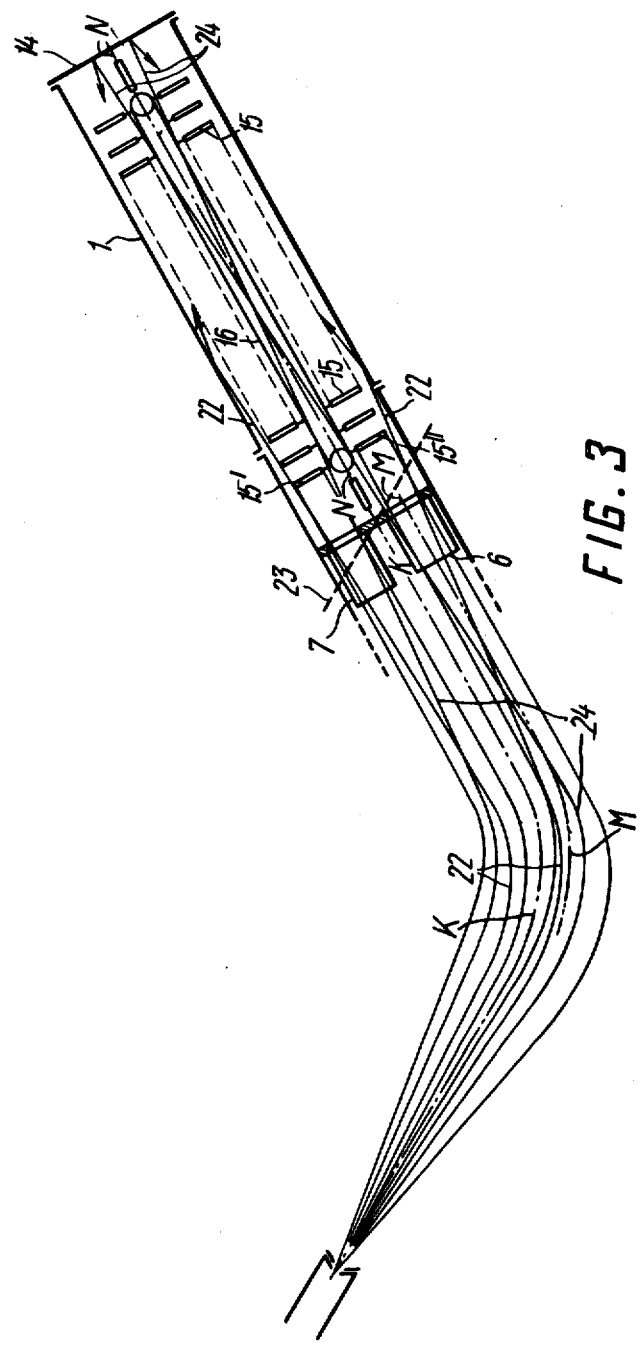
FIG. 3 illustrates a particular case of feeding parts in ion-beam machining, with the angle between the axis of the ion beam and the surface being machined being other than 90 deg.
Figure 4:
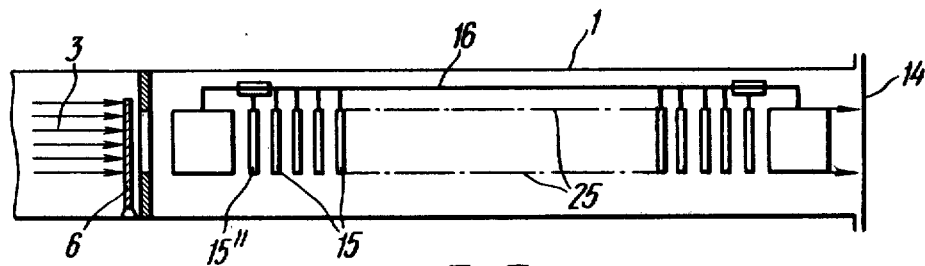
FIGS. 4 and 5 show schematically, in two projections, ion beam trajectories of the known apparatus.

Inasmuch as the axis MM of the ion beam 3 is aligned with the center line of the ion-beam machine, the ion beam 3 does not touch the side walls of the sealed case 26 (FIG. 8) (compare the prior-art apparatus presented in FIG. 3). Moreover the parts being machined and seated in the holder 37' are arranged at a constant equal distance from the focal plane 23 of the ion beam 3. Owing to this feature, diffusion of material of the side walls of the sealed case 26 acted upon by the ion beam 3 is precluded on the one hand, and the machining efficiency is improved, on the other, with the quality of the machined parts being improved as a result.

During machining of the parts with the ion beam 3, the framework 35 is rigidly coupled to the sealed case 26 by means of the locking pin 47 mating with the detent 48. To turn the framework 35, the locking pin 47 must be disengaged from the detent 48. Additionally, the framework 35 mounts another locking pin 49 (FIG. 7) which permits rigid connection of the hub 34 to the framework 35 when the framework 35 is turned about the longitudinal axis 00 thereof. In this case, the locking pin 49 is mated with the hub 34.

The arrangement for feeding the holder 37' (FIGS. 6 and 7) carrying the parts to be machined with the ion beam 3, comprises a slide 50, the support 51 thereof bears the holder 31' extended from the radial slot 36' in the drum 33. The slide 50 travels over a beam 52 attached to the inside wall of the sealed case 26. The slide 50 is hinge-connected by a stud 53 to a connecting rod 54 linked to a crank 56 by another stud 55. The crank 56 is seated on one end of a shaft 57 revolving in bearings 58. The other end of the shaft 57 receives a bevel gear 59 mating with another bevel gear 60 seated on a driving shaft 61 coupled to the external drive (not shown). The shaft 61 revolves in bearings 62.

To permit removal and installation of the detachable drum 33, the sealed case 26 is furnished with a port 63 shut with a sealing door 64. A flange 65 installed on the sealed case 26 serves to attach the apparatus of the invention to an ion-beam machine. The inside surfaces of the walls of the sealed case 26 located in the zone of the ion beam 3 is lined with a facing 66. The sealed case 26 accommodates screens 67 which serve to protect the detachable drum 33, the drum revolving means the means for turning framework 35 and the means for feeding the holders 37 with parts being machined against possible deposition of the products of diffusion of the inside walls of the sealed case 26 acted upon the ion beam 3.

Prior to operation, the slide 50 is placed at the uppermost position wherein the holder 37' located above the support 51 of the slide 50 is removed from the slot 36' of the drum 33. In this case, the holder 37, rests upon the support 51.

First, the apparatus is prepared for use. The detachable drum 33 mounting the holders 37 with the parts to be machined is introduced through the port 63, installed on the hub 34 and fixed in position. The shutters 28 are operated to adjust the desired area of the aperture 27. Now the port 63 is sealed by the door 64 and the air is evacuated from inside the sealed case 26 until a desired vacuum is produced. The aperture 27 is then closed with the door 30. The ion-beam machine is adjusted to form the scanning beam 3 and to direct it on the door 30. Then the desired ion beam current density measured by the probes 31 is set. The handwheel 46 is operated manually to disengage the locking pin 47 from the detent 48, with the framework 35 rigidly coupled to the sealed case 26, and with a definite angle set between the axis MM of the ion beam 3 and the surface of the parts mounted on the holders 37. The locking pin 49 is extracted from the hub 34 to permit free rotation of the hub 34 together with the detachable drum 33 about the lateral axis 00 of the framework 35.

Then the holders 37 with the parts are exposed to the ion beam 3 for machining. The handle 32 is turned to open the door 3, and the ion beam 30 is admitted to the working zone in the machine. The arrangement for feeding the holder 37' with the parts to be machined is started. The rotary motion of the driving shaft 61 is transmitted by the pair of the bevel gears 60 and 59, and by the shaft 57 to the crank 56. The crank gear comprising the parts 56 and 53 converts the rotary motion of the shaft 57 into the reciprocal motion of the slide 50. Said slide 50 placed earlier to the uppermost position is caused to move the lowermost position, thereby allowing the holder 37' acted upon by gravity to lower to the target plane of the ion-beam machine.

Since the holder 37' with the parts fed to the machining area is extracted from the slot 36' in the drum 33, the construction of the holders 37 may be simplified. Clearances, slots and holes in the holders 37 are tolerable. This feature is essential in case when multilateral machining of parts is required because the holder must be provided with ports wherein the parts are fitted. However, the size and shape of the ports in the holder do not always correspond to those of the parts to be machined.

In addition, the construction of the apparatus as a whole is also simplified because the use of the slotted holders eliminates the need for additional protection, and full loading of the closed-loop conveyer (such as the drum 33) with the holders 37 carrying the parts to be machined becomes practicable no matter whether there are clearances, slots and holes in the holders 37, or not. Consequently, the apparatus is convenient and the operating efficiency thereof is high. After the holder 37' carrying the parts is lowered, the drive of the shaft 61 is cut off and the holder 37' is exposed to the ion beam 3. On completion of machining, the drive of the shaft 61 is started again. The slide 50 returns to the uppermost position and introduces the holder 37' with the machined parts into the radial slot 36' in the detachable drum 33. Now the arrangement for turning the detachable drum 33 is switched on. The torque of the shaft 38 is transmitted by the gears 39 and 40 to the shaft 41, and further through the worm gear comprising the parts 42 and 43, to the shaft 44 which receives the hub 34 in assembly with the detachable drum 33. The drum 33 turns through one step. As a result, the holder 37' with the machined parts is fixed in the radial slot 36' in the detachable drum 33, and the next holder 37 is removed from the respective radial slot 36 and is placed on the support 51 of the slide 50.

To permit reciprocal motion of the holder 37' with the parts being machined, the drive of the shaft 61 operates continually without interruptions, and the arrangement for turning the detachable drum 33 is not mobilized when the slide 50 reaches the uppermost point. After machining of the holder 37' set to reciprocal motion, the drive of the shaft 61 is stopped at the instant when the slide 50 is set to the uppermost position. Now the drive of the shaft 38 is started and the holders 37' and 37 located above the support 51 are exchanged as described hereinabove.

Though ion beams 68 (FIG. 8) and 69 (FIG. 9) project beyond the holder 37' with the parts being machined through the clearances resulting due to differences in dimentions of the holder 37' and aperture 27, they do not fall onto the parts of the actuating devices. Moreover, there are provisions for protection of the rear wall of the sealed case 26 lined with the facing 66 (compare the apparatus of FIG. 1). The facing 66 is made of material highly resistant to the ion beam or similar to that of the parts being machined, whereby the products of diffusion do not affect the quality of the manufactured parts. Hence, the quantity of the products of diffusion of the inside walls of the sealed case 26 is immaterial even during the operation when the holder 37' is reciprocating in the target plane of the ion-beam machine. This contributes to a higher quality of the machined parts.

The clearance between the edges of the holder 37' and those of the aperture 27 does not depend on the number of the holders 37 mounted on the closed-loop conveyer. Moreover, said clearance in the apparatus of the present invention is either eliminated entirely, or is very narrow so that the ion beams 68 (FIG. 8) and the ion beams 69 (FIG. 9) are greatly attenuated. This advantage is achieved due to the fact that the holder 37' removed from the closed-loop conveyer (i.e., the drum 33) can much easier be positioned accurately in relation to the aperture 27, than the holders 15' and 15'' (FIGS. 1 and 2) attached to the load-carrying chain conveyer 2. This feature contributes to the high quality of the parts machined.

Since the holder 37' (FIGS. 6 and 7) delivered to the machining area is removed from the closed-loop conveyer (i.e., the drum 33) and may be fixed in position or reciprocating as desired, the apparatus of the present invention is applicable for use with any type of the ion-beam machines and does not depend upon the shape of the ion beam (sheet, pencil, etc.) and upon the scanning mode (in one or two normal directions), so that the range of application of the apparatus of this invention is greatly widened.

Rotation of the detachable drum 33, delivery of the holder 37' to the machining area and reinstalling thereof into the radial slot 36' in the drum 33 are programmed and accomplished automatically.

When there is need to machine the parts in the holders at some other angle, as is the case with machining of the opposite sides of the parts, the framework 35 together with the hub 34 and the detachable drum 33 is turned through a preset angle of, say, 180 deg. For this purpose, the locking pin 49 is mated with the hub 34, and the locking pin 47 is disengaged from the detent 48. The hub 34 in assembly with the detachable drum 33 is thereby rigidly connected to the framework 35, and the framework 35 proper is allowed to turn freely about the longitudinal axis 00 thereof. The handwheel 46 operated manually turns the framework 35 together with the hub 34 and the detachable drum 33 through the desired angle. Then the locking pin 47 is mated with the detent 48, and the locking pin 49 is extracted from the hub 34. Now the framework 35 is once again rigidly attached to the sealed case 26, and the hub 34 along with the detachable drum 33 can turn about the lateral axis 0'0' of the framework 35. With the frame 35 set to a new position relative to the axis MM of the ion beam 3, the parts fitted into the holders 37 are machined in the same manner as above.

At the final stage, the apparatus is prepared for removal of the machined parts. The door 30 is shut by means of the handle 30. The vacuum chamber of the ion source in the ion-beam machine is sealed, the vacuum inside the sealed case 26 is removed, the door 64 is opened, and the drum 33 mounting the holders 37 with the machined parts is detached and removed from the hub 34. Another detachable drum already loaded with the holders 37 carrying the parts to be machined is seated on the hub 34 and fixed in position. Then the procedure is repeated as described hereinabove.

The holders 37 with the parts already machined are removed from the detached drum 33 and are replaced with new holders 37 carrying the parts to be machined. The machined parts are unloaded from the holders 37 and are forwarded for further processing. The empty holders 37 are loaded again with the parts to be machined with the ion beam.

The present invention provides for accomplishment of a wide range of functions and permits solution of many problems arising in processes which involve feeding a plurality of parts for many-side machining by means of a flow of a certain substance.

The invention enjoys a number of advantages, including multipurpose application, high operating efficiency, compact design, simple construction, long service life and durability of the component parts.

The apparatus of the present invention can most advantageously be used for feeding parts to be machined with an ion beam, whereupon the quality of the machined parts increased due to improved handling of the parts during machining.

The apparatus, according to the present invention, finds wide application in mass production of a variety of semiconductors, for example, in manufacture of doped and dielectric layers by a novel method of ion bombardment, as well as in other processes.

What is claimed is:

1. An apparatus for feeding parts to a target plane in multilateral ion-beam machining, comprising a sealed case with an aperture to admit an ion beam along an axial path; a door for shutting said aperture; probes built into said door to check distribution of the ion beam current; a framework located inside said case and turnably mounted about an axis at a definite angle relative to the axis of the ion beam; holders for the parts to be machined; and means including a closed-loop movable conveyer for holding and moving the parts in said holders, said conveyer being enclosed in said framework and turnable together therewith about said axis, and means for removing the holders successively during movement of the conveyer and for introducing the parts into the ion beam along the turnable axis of the framework whereby each part being delivered to the target area can be machined on all sides without altering the direction of said ion beam, with all other apparatus for movement of said conveyer and framework outside the zone of the ion beam.

2. An apparatus as claimed in claim 1, wherein the turning axis of said framework and the axis of the ion beam form an angle of intersection equal to 90°.

3. An apparatus as claimed in claim 1, wherein said holders are detachable from said framework.

4. An apparatus as claimed in claim 1, wherein said closed-loop conveyer is detachable from said framework.

5. An apparatus as claimed in claim 1, wherein said closed-loop conveyer comprises a drum mounted on said framework for rotation about an axis distinct from the turning axis of the framework with respect to the case.

6. An apparatus as claimed in claim 5, wherein said turning axis of the framework and the axis of rotation of the drum are perpendicular to one another.

7. An apparatus as claimed in claim 5, wherein the axis of rotation of the drum is horizontal and the holders are removed vertically downwards from the framework to be brought into the path of the ion beam.

8. An apparatus as claimed in claim 7, wherein the means for removing the holders comprises a vertical reciprocable support element for said holders.

* * * * *